United States Patent [19]

Houston

[11] Patent Number: 5,214,610
[45] Date of Patent: May 25, 1993

[54] MEMORY WITH SELECTIVE ADDRESS TRANSITION DETECTION FOR CACHE OPERATION

[75] Inventor: Theodore W. Houston, Richardson, Tex.

[73] Assignee: Texas Instruments Incorporated, Dallas, Tex.

[21] Appl. No.: 754,281

[22] Filed: Aug. 30, 1991

Related U.S. Application Data

[63] Continuation of Ser. No. 411,087, Sep. 22, 1989, abandoned.

[51] Int. Cl.$^5$ .............................................. G11C 7/06
[52] U.S. Cl. ............................ 365/233.5; 365/189.05; 365/203
[58] Field of Search ................. 365/233.5, 189.05, 203

[56] References Cited

U.S. PATENT DOCUMENTS

| | | | |
|---|---|---|---|
| 4,573,147 | 2/1986 | Aoyama et al. | 365/233.5 |
| 4,577,293 | 3/1986 | Matick et al. | |
| 4,616,342 | 10/1986 | Miyamoto | 365/233.5 |
| 4,636,991 | 1/1987 | Flannagan et al. | 365/233.5 |
| 4,658,381 | 4/1987 | Reed et al. | 365/233.5 |
| 4,701,889 | 10/1987 | Ando | 365/233.5 |
| 4,707,809 | 11/1987 | Ando | 365/233.5 |
| 4,719,602 | 1/1988 | Hag et al. | 365/230 |
| 4,849,937 | 7/1989 | Yoshimoto | 365/189.05 |
| 4,855,957 | 8/1989 | Nogami | 365/189.05 |
| 4,872,143 | 10/1989 | Sumi | 365/233.5 |
| 4,894,803 | 1/1990 | Aizaki | 365/233.5 |

FOREIGN PATENT DOCUMENTS 61-5493  1/1986  Japan ............................. 365/233.5

OTHER PUBLICATIONS

Goodman, et al. "The Use of Static Column RAM as a Memory Hierarchy," 11th *Symp. on Computer Architecture*, (IEEE Computer Soc. Press, 1984) pp. 167–175.
Ashmore et al., "A 20ns 1Mb CMOS Burst Mode EPROM" *ISSCC Digest of Technical Papers* (IEEE, Feb. 1989) pp. 40–41.
Sawada et al., "A 32-KByte Integrated Cache Memory," *IEEE J. Sol. State Circ.*, vol. 24, No. 4 (Aug. 1989) pp. 881–888.
Ward et al., "Static-Column RAM as Virtual Cache," Laboratory for Computer Science, MIT, Cambridge Mass.
Smith, "Cache Memory Design: An Evolving Art," *Spectrum* vol. 24, No. 12 (IEEE, 1987) pp. 40–44.

*Primary Examiner*—Joseph E. Clawson, Jr.
*Attorney, Agent, or Firm*—Rebecca A. Mapstone; James C. Kesterson; Richard L. Donaldson

[57] ABSTRACT

A memory device having a fast access, or cache, mode is disclosed. The memory has an address transition detection circuit for detecting a transition in a portion of the memory address presented to the memory, for example the row address. The memory is operable to select a previously sensed memory cell responsive to the remainder of the address without requiring a transition in the first portion of the address, and without requiring the precharge portion of the memory cycle. For example, the column address selects a bit to be communicated from the sense amplifiers, which are retaining the previously sensed data. The sense amplifiers retain the previously sensed data for so long as no transition in the row address occurs; the memory may include a terminal for receiving a signal which disables the effect of an address transition, so that the fast access mode is retained without regard to transitions in the row address portion of the memory address. A second embodiment having the fast access mode also has its array organized into blocks, so that the sense amplifiers for each array block can store data from a memory row different from those stored in the sense amplifiers for other blocks, allowing for an improved cache hit rate.

12 Claims, 4 Drawing Sheets

MEMORY WITH SELECTIVE ADDRESS TRANSITION DETECTION FOR CACHE OPERATION

This invention was made with Government support under contract No. DNA 001-86-0090 awarded by the Defense Nuclear Agency. The Government has certain rights in this invention.

This application is a continuation of application Ser. No. 07/411,087 filed Sep. 22, 1989 now abandoned.

This invention is in the field of integrated circuits, and is more specifically directed to semiconductor memories having modes for fast access.

BACKGROUND OF THE INVENTION

A continuing trend in the semiconductor field is the increase in the density of storage bits per chip in semiconductor memory devices. This trend has continued for high density, medium performance, memories such as dynamic random access memories (dRAMs). In the past decade, each new generation of dRAM has provided an increase in storage capacity of a factor of four over the prior generation, with the newest generation of chips containing 4 Mbits each. The rapid increase of the density of such memories has created increased pressure to increase memory bandwidth, i.e., the speed at which the user can access the bits in the memory. Without improvement of memory bandwidth along with the increase in the density of the memory, the additional bits provided by a new memory generation have decreasing utility to the user.

This bandwidth pressure has also led to increased emphasis on increasing the density and also the performance of static random access memories (sRAMs) which can be used not only for main memory in a system, but also as large high speed caches in a memory system. With the advent of high performance CMOS and BiCMOS process technologies, high density sRAMs with access times less than 10 nsec have been fabricated, as described in Tran et al., "An 8ns BiCMOS 1Mb ECL SRAM with a Configurable Memory Array Size," 1989 *IEEE ISSCC Digest of Technical Papers* (IEEE, 1989), pp. 36-37. sRAM devices such as these can be used not only for main memory in a system, but also as large high speed caches in a memory system.

As is well known, a cache memory is a common technique used in data processing systems for improvement of system memory performance. A cache memory is a relatively small and high-speed memory which stores data from a number of main memory locations surrounding a memory location which has been addressed. The theory of cache operation is that the system central processing unit (CPU) will frequently address a memory location which is adjacent, or near (in terms of address value), a memory location that it has recently addressed. Each group of data stored in the cache is associated with a "tag", or a portion of the memory address which is common to the data stored in the cache, and a comparator compares a portion of the memory address presented by the CPU with the tag or tags associated with the data stored in the cache. If the desired memory address matches a tag value (i.e., a cache "hit" occurs), the cache can be accessed to more quickly provide the desired data than if the main memory were addressed, thereby improving the effective memory bandwidth of the system.

In the event that the appropriate portion of the desired memory address does not match the tags associated with the data stored in the cache (i.e., a cache "miss" occurs), the main memory must be accessed, resulting in a delay relative to a cache access. Generally a portion of the cache is then refilled with data from main memory in the locations proximate to the newly addressed main memory location. The additional time required to access main memory instead of the cache, plus the additional time required to fill the cache with the new data from the proximate addresses to the new memory address (if done for each miss), is commonly referred to as the "miss penalty". It should be noted that the time required to refill the cache, as well as the initial access to main memory for the desired memory address, depends upon the main memory cycle time, and is directly proportional to the number of bits in the cache (or portion of the cache associated with a given tag, such portion commonly referred to as a "line" of the cache). As a result, if the miss penalty becomes large, the effective memory bandwidth of the system will decrease, even with relatively low miss rates. In improving the system performance by improving the cache bandwidth, it is therefore important not only to reduce the rate of cache misses, but also to reduce the miss penalty associated with each cache miss.

It is desired, for purposes of reducing system cost, as well as system complexity, to incorporate cache accesability within the main memory device itself in order to reduce the miss penalty. It has been proposed that dRAMs having the static column decode feature be used in a cache organization. See J. Goodman and M-C Chiang, "The use of Static Column RAM as a Memory Hierarchy," *The 11th Annual Symposium on Computer Architecture* (IEEE Computer Society Press, 1984), pp. 167-74. However, a cache miss in such a memory will require that the dRAM operation of precharging the dynamic row decoding and sense circuitry, followed by presentation of a row address together with a row address strobe be performed prior to the access of a bit associated with the new row address. It should be noted that dRAMs such as this have multiplexed address pins, so that the presentation of the column address must wait until after the presentation of the row address. Accordingly, the time penalty for such an operation in the event of a cache miss reduces the benefits of using such a memory in a "cache" mode.

Due to the non-multiplexed and static (i.e., non-clocked) operation of conventional sRAMs, the disadvantages of using static column decode dRAMs as an integrated memory with on-chip cache can be somewhat reduced. This is especially the case for some conventional sRAM devices which utilize address transition detectors for detecting a change in the address presented thereto, so that decoding of the address need only occur when a new address is received. In addition, for those static memories which utilize some dynamic features, such as bit line precharge and dynamic address decoding, these dynamic operations will be initiated by the address transition detection circuitry so that they are done only in the event of a memory address transition.

In conventional memories which utilize address transition detection, however, a change of address will cause the memory to precharge and to decode the address even for those cycles for which the row address does not change. For the example of a 64kbit sRAM having 256 rows and 256 columns, where a single column is associated with a single sense amplifier, a large number of bits (e.g., 256 bits in a 64 kbit memory) are potentially accessible from a single row. However, if address transition detection is performed on the entire address, as is conventionally done, a full memory cycle will be performed in such conventional memories even when the desired data is already present in the sense amplifiers, and when precharge and row address decoding is unnecessary.

The performance of a full memory cycle will dissipate more power than will a cycle consisting of column decode and output of the state of the selected sense amplifier, since the full memory cycle includes additional operations such as precharge, energizing of the selected row, and sensing. Accordingly, if a full memory cycle is not performed in those instances when only an access of previously sensed data from a previously selected row is desired, the power dissipation of the memory, measured over normal system operation, can be reduced.

It is therefore an object of this invention to provide a memory which allows for faster bit access from a previously sensed row, without requiring a new row to be selected and sensed.

It is a further object of this invention to provide such a memory using address transition detection on only a portion of the memory address for initiating a precharge portion of the cycle, so that a faster access mode is available for the data bits accessible by transitions of the remainder of the memory address.

It is a further object of this invention to provide such a memory wherein the address transition detection can be disabled, ensuring that the memory remains in the fast access, or cache, mode.

It is a further object of the invention to provide such a memory which is organized into blocks, each having cache operation therefrom, to improve the cache hit performance of the memory.

Other objects and advantages of the invention will be apparent to those of ordinary skill in the art having reference to the instant specification together with the drawings.

SUMMARY OF THE INVENTION

The invention may be incorporated into a random access memory, such as a static random access read/write memory, which uses address transition detection on a portion of its received address for initiating precharge of the memory and decoding of that portion of the address. The memory is constructed so that access of multiple bits from a previously sensed portion of the memory (e.g., a row) can be accomplished from the remainder of the memory address without initiation of precharge. The memory may also be constructed with the ability to disable the address transition detection circuit, to ensure that the cache mode is maintained regardless of transitions of the previously detected portion of the address.

BRIEF DESCRIPTION OF THE DRAWINGS

FIG. 3b is a timing diagram illustrating the operation of the circuitry of FIG. 3a.

DETAILED DESCRIPTION OF THE PREFERRED EMBODIMENTS

Figure 1:
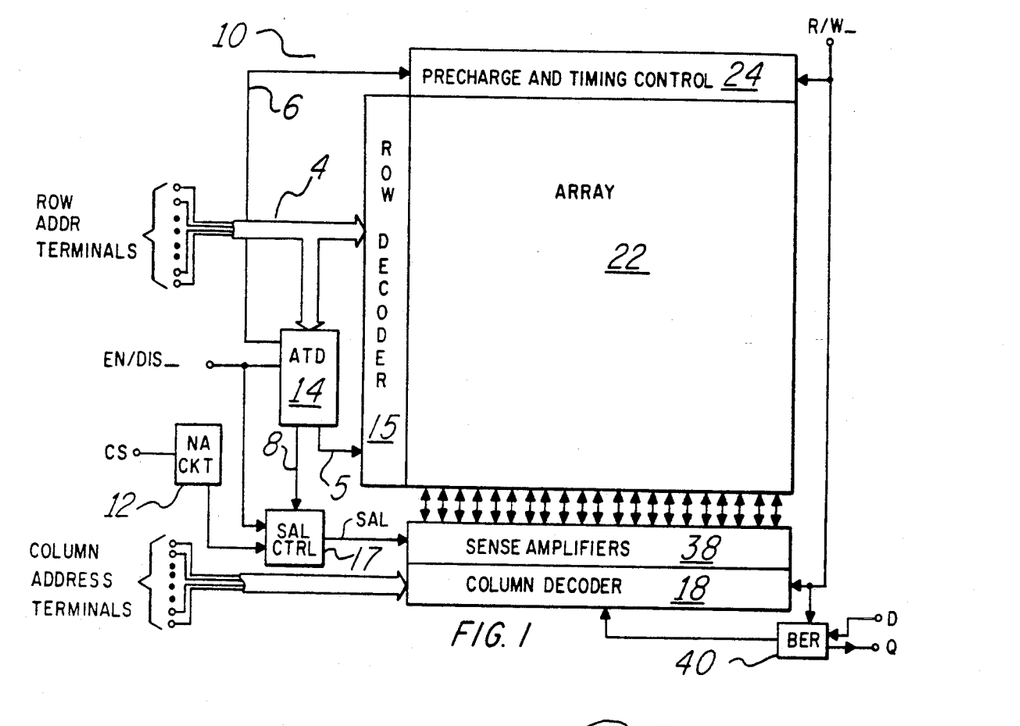
FIG. 1 is a block diagram of a static RAM constructed according to a first embodiment of the invention.

Referring now to FIG. 1, a memory 10 constructed according to a first embodiment of the invention will be described. The following description will be for the example of a static random access memory (sRAM), although it should be noted that the invention is equally applicable to other types of read/write memories, as well as read-only memories, both mask programmable and electrically programmable. Memory 10 has an array 22 of memory cells, in this case static memory cells, which are organized in rows and columns. An exemplary organization of array 22, for the case of a 64 kbit memory, is 256 rows and 256 columns. Row decoder 15 receives a row address on bus 4 from those address terminals associated with the row address, and is operable to energize the row in array 22 which corresponds to the received row address.

Each of the columns in array 22 of this embodiment are associated with a sense amplifier 38, which is for sensing the data state stored in the memory cell of the column which is in the selected row. In this first preferred embodiment, as will be explained in greater detail hereinbelow, sense amplifiers 38 are associated with the columns in array 22 on a one-to-one correspondence; other organizations of the sense amplifiers 38 may alternatively be used. Column decoder 18 receives the column address portion of the address from the terminals associated with the column address, and decodes the same in order to select one or more of sense amplifiers 38 to be read from or written to, according to the value of the column address. Access is accomplished by communication of the selected sense amplifier 38 with input-/output buffer 40 which, in turn, communicates the data from the selected sense amplifier 38 to output terminal Q in a read cycle, and communicates data from input terminal D to the selected sense amplifier 38 in a write cycle; terminal R/W_ receives a read/write signal to control the direction of the data flow, in the conventional manner. While memory 10 of FIG. 1 is illustrated as having single dedicated input and output terminals D and Q, respectively, memory 10 may alternatively be organized in a wide word (e.g., by-four, by-eight) manner, and also alternatively utilize single or multiple common input and output terminals, if desired.

Associated with array 22 is precharge and timing control circuitry 24, for precharging the bit lines in array 22 associated with the columns therein. My co-pending application Ser. No. 213,814 filed Jun. 30, 1988 and assigned to Texas Instruments Incorporated illustrates an example of such circuitry. In this preferred embodiment, as will be described in greater detail below, the bit lines in array 22 on which the data is to be communicated between sense amplifiers 38 and the memory cells in array 22 are to be precharged prior to the sensing of a newly selected row. This is advantageously done upon receipt of a new row address. In addition, precharge and control circuitry 24 receives an externally driven read/write signal on line R/W_, so that the sensing operation is controlled according to the desired operation. During precharge of the bit lines, it is preferable that the sense amplifiers 38 associated therewith are disconnected from the bit lines, so that the previously sensed data state does not affect the potential to which the bit lines are to be precharged. Accordingly, the sense amplifiers 38 are to be controlled to so operate in conjunction with the precharge and control circuitry 24.

In this embodiment of the invention, the operation of row decoder 15, precharge and control circuitry 24, and sense amplifiers 38 is dependent upon the receipt of a new row address at the row address terminals. Accordingly, address transition detection circuit (ATD) 14 is connected to bus 4 to receive the row address. Responsive to a transition of the state of the row address at the row address terminals, ATD 14 issues signals (preferably a pulse, as will be described hereinbelow), on line 5 to row decoder 15, on line 6 to precharge and control circuitry 24, and on line 8 to sense amplifier latch control circuitry 17. Accordingly, the detection of a transition of the row address will cause ATD 14 to initiate the precharge portion of the memory cycle, to disconnect the sense amplifiers 38 from the bit lines in the array 22, and to initiate decoding of the row address by row decoder 15. ATD 14 is constructed according to any of the various conventional address transition detection circuits known in the art.

As described in my copending application Ser. No. 213,814, and as will be described in detail hereinbelow, a transition of the row address detected by ATD 14 will initiate a precharge and equalization operation, by which precharge and control circuitry 24 will set the potential of the bit lines in array 22 to a predetermined potential, prior to selection of the row by row decoder 15. In accomplishing this operation, as well as the sensing operation itself, sense amplifiers 38 must be controlled so that they remain latched to the selected memory cell in the column, or isolated from the bit lines, depending upon the desired operation. Sense amplifier latch control circuitry 17 generates a signal on line SAL responsive to a pulse on line 8 from ATD 14, so that sense amplifiers 38 are disabled during the precharge operation and are enabled thereafter to sense and retain the data from the selected row. Alternatively, ATD 14 can directly control sense amplifiers 38, without requiring additional sense amplifier latch control circuitry 17, so long as the signal presented by ATD 14 responsive to a transition has the appropriate timing and duration within the memory cycle.

If row decoder 15 is dynamic, ATD 14 will initiate the decoding operation by sending the appropriate signal on line 4 responsive to a transition of the row address. It should be noted, however, that static decoding of the row address may alternatively be used, in which case it is not necessary that ATD 14 initiate the decoding operation of row decoder 15. It should also be noted that it is not necessary that the portion of the address to which ATD 14 is responsive to initiate the precharge operation correspond to the row address, with the remainder of the address to which ATD 14 is not responsive corresponding to the column address, although such use of the row and column addresses is especially beneficial in this embodiment.

Other organizations of memories which can achieve the benefits of the fast access mode described herein will be apparent to those of ordinary skill in the art having reference to this specification. For example, the embodiment described above has one of sense amplifiers 38 associated with a single column in array 22. An alternative organization which is especially suitable for static RAMs is to have one of sense amplifiers 38 associated with multiple columns in array 22. In this arrangement, a portion of the column address is used to select which of the multiple columns is to be selected for communication with each sense amplifier 38. For this alternative organization, the portion of the address to which ATD 14 would be responsive would include not only the row address, but also that portion of the column address which is used to select one of the multiple columns associated with each one of sense amplifiers 38 for communication therewith.

Since ATD 14 detects a transition on only a portion of the address presented to memory 10 (e.g., the row address), the precharge, sense amplifier disable, and row decode operations will not be initiated for a transition in the state of the remainder of the address (i.e, the column address). This provides the fast access, or cache, mode of operation of memory 10 constructed according to the instant invention, as changes in the portion of the address which selects a bit from sense amplifiers 38 (i.e., the "cache" of the memory) does not cause the operation of ATD 14. Once sense amplifiers 38 have latched therein the data state of the memory cells in array 22 which are in the selected row, column decoder 18 in memory 10 is operable to decode the received column address for communication to buffer 40 and from there to the D and Q terminals. A change in the column address presented to memory 10 will merely cause such communication to a different sense amplifier 38, which can be done in a significantly shorter time than would be required were the precharge, row decode and sensing operations to be performed. Accordingly, memory 10 provides a fast access, or cache, mode so long as the value of the portion of the address received by ATD 14 does not change.

In addition to providing a faster access of the desired bit, the access is performed without requiring the operations of precharge, row decoding and selection, and sensing of the newly selected row, each of these operations consuming power. Accordingly, the provision of the fast access, or cache, mode not only improves the memory performance from a speed standpoint, but also improves the memory performance relative to overall power dissipation. The reduced power dissipation will result from the efficiency of not performing access of the memory array for those cycles which do not require array access; over the course of a large number of memory operations, the power dissipation will thus be reduced by a factor which correlates to the cache hit rate.

The decoding of the column address by column decoder 18 is done statically, in this first preferred embodiment. It should be noted that a second ATD circuit may be provided which operates responsive to transitions in the column address, for selecting the desired one of sense amplifiers 38 to be accessed. Such a second ATD circuit can control the operation of other circuitry in memory 10, for example enabling the input/output buffer 40 responsive to a change in the column address, or also initiating dynamic decoding of the column address by column decoder 18. Provision of such a second ATD circuit is fully compatible with the invention described herein, so long as a transition of the column address does not initiate the operations required for access of memory array 22, such as the precharge, row decode and selection, and sensing operations described herein which are initiated by a row address transition detected by ATD 14.

In this first preferred embodiment, ATD 14 is further responsive to signals presented to terminal EN/DIS—. In this example, during such time as terminal EN/DIS— is at a low logic level, ATD 14 is disabled from detecting transitions of the row address, and accordingly no precharge, row decoding and sensing operations can be initiated. In addition, sense amplifier latch control circuitry 17 is further responsive to the state of terminal EN/DIS—, as will be described below, for causing data sensed and stored by sense amplifiers 38 to remain there during such time as the state of terminal EN/DIS— remains low, i.e., while ATD 14 is disabled. Accordingly, memory 10 has a second way by which it can operate a fast access, or cache, mode. So long as line EN/DIS— has disabled ATD 14, with sense amplifiers 38 retaining the data stored therein, memory 10 will remain in the cache mode with column decoder 18 selecting the sense amplifiers 38 for external communication responsive to the column address, regardless of transitions in the row address from the value selecting the row stored in sense amplifiers 38. It should be noted that a memory may be constructed according to this invention without the feature of disabling address transition detection; the feature of disabling ATD 14 provides yet further control of the operation of the memory.

Enable circuitry 12 receives an external chip select signal from terminal CS, for controlling the operation of the various elements in memory 10 according thereto. Enable circuitry 12 will disable (by connections not shown in FIG. 1 for the sake of clarity) operative portions of memory 10 in the event that memory 10 is not selected, for example by a low logic level at terminal CS. As is conventionally done, by way of memory selection via a chip select signal at terminal CS, multiple ones of memories 10 may have its address terminals, data terminals and control terminals connected in parallel, with unselected ones of memories 10 neither affected by nor affecting the operation of the selected ones of memory 10.

In this embodiment, column decoder 18 is a static column decoder; as is well known in the art, a static column decoder 18 constantly decodes the column address presented thereto, so that a transition in the column address will result, after the time necessary for decoding, in the immediate selection of a different column in array 22. Static decoding is preferred in this embodiment for column decoder 18, as it is believed that the cache access mode performance is maximized by static column address decoding. However, it should be noted that address transition detection can also be applied to the column address, in the event that the column decoding is to be done dynamically. In order to continue to allow the cache access mode in this arrangement, however, the address transition detection on the column address must be independent from that which initiates the precharge and sensing operation (i.e., the row address transition detection).

Figure 2:
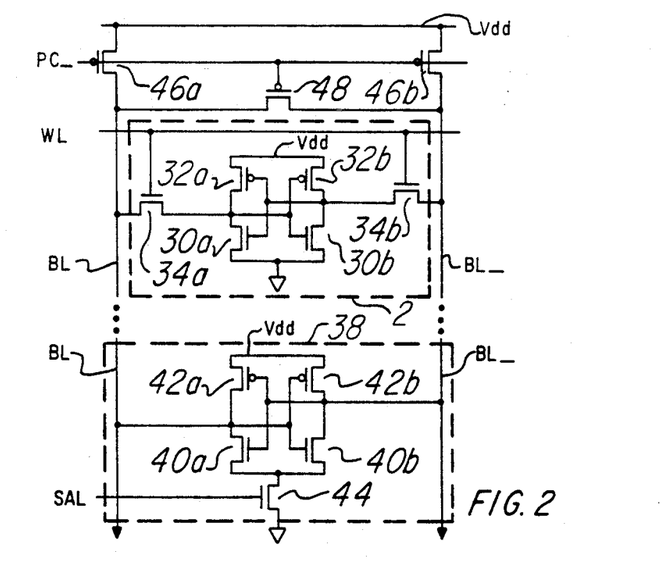
FIG. 2 is an electrical diagram, in schematic form, of a column in the memory of FIG. 1, illustrating its association with the precharge and sense amplifier circuitry.

For purposes of explaining the construction and operation of memory 10 in greater detail, FIG. 2 illustrates the operation of a column in array 22, together with one of sense amplifiers 38 associated with the column The construction of the column of FIG. 2 is preferred for use in a static memory 10 constructed according to the invention, but other construction and arrangements of memory cells 2 with a sense amplifier 38 may of course be alternatively used in memory 10 according to the invention. The circuit of FIG. 2 is explained in greater in my copending application Ser. No. 252,287 filed Sep. 30, 1988 and assigned to Texas Instruments Incorporated Each column in array 22 contains a number of memory cells 2, with each of memory cells 2 associated with a different row in array 22. Memory cells in conventional sRAMs are generally constructed of cross-coupled inverters. The static memory cell 2 of FIG. 2 is of the CMOS variety, with each inverter comprising an n-channel drive transistor 30 and a p-channel load transistor 32 having their gates connected together and to the drains of the transistors 30 and 32 of the opposing inverter in the cell 2. The sources of the p-channel load transistors 32a and 32b are connected to the $V_{dd}$ power supply, and the sources of the n-channel drive transistors 30a and 30b are connected to ground. Each of the columns in array 22 is associated with a pair of bit lines BL and BL— which communicate a differential signal thereupon corresponding to the data state stored by the selected memory cell 2. Connection of the memory cells 2 to bit lines BL and BL— is controlled by pass transistors 34 having their source/drain path connected between the node at the drains of the transistors 30 and 32 for each of the inverters and complementary bit lines BL and BL—, respectively As is typical in conventional sRAM devices, a word line WL, driven by the output of row decoder and controls the gate of the pass transistors 34 so that the memory cell 2 associated therewith will be in communication with the bit lines BL and BL— responsive to the word line WL for the particular row being energized by row decoder 15 according to the row address.

The sense amplifier 38 of FIG. 2 is connected directly to bit lines BL and BL— and, similarly as memory cells 2, consists of a pair of cross-coupled CMOS inverters. Each inverter has an n-channel drive transistor 40 and a load device, here consisting of a p-channel transistor 42. The inverters consisting of transistors 40a and 42a and of transistors 40b and 42b have their gates connected together and to the drains of the opposing inverter in conventional cross-coupled fashion. The sources of transistors 42a and 42b are biased to $V_{dd}$, and the sources of transistors 40a and 40b are connected to a pass transistor 44, which controls the biasing of the sources of transistors 40 to ground responsive to a latch signal SAL received at the gate thereof from sense amplifier latch control circuitry 17. Accordingly, if a memory cell 2 is connected to bit lines BL and BL— responsive to the activation of a word line WL, sense amplifier 38 will receive a differential signal on bit lines BL and BL— and, if line SAL is at a high logic level, will latch a data state corresponding to the stored data state in the selected memory cell 2.

P-channel transistors 46a and 46b have their source/drain paths connected between bit lines BL and BL—, respectively, and $V_{dd}$. The gates of p-channel transistors 46a and 46b receive a signal at line PC— from precharge and control circuitry 24. As is indicated by its nomenclature, line PC_ carries a signal which, in its active low logic level, will cause transistors 46a and 46b to conduct, connecting the $V_{dd}$ potential to both bit lines BL and BL_ to precharge them. Equalization transistor 48 is also a p-channel transistor, and has its source/drain path connected between bit lines BL and BL_, with its gate controlled by line PC_. Accordingly, during the precharge operation, transistor 48 is also in the conductive state, in effect connecting bit lines BL and BL_ together so that they are precharged to the same potential. Such equalization of the bit lines is preferred so that mis-sensing due to bit lines BL and BL_ having different potentials at the time that a memory cell 2 is connected thereto by row decoder 15 is avoided.

As described above, memory 10 constructed according to the invention has the capability of a fast access, or cache mode, by appropriate control of the WL, PC_ and SAL lines. In this embodiment, the signal on line WL corresponding to the selected row will remain at a high logic level for so long as the same row address is at the row address terminals, or for so long as ATD 14 is disabled, so that a write operation performed to the selected sense amplifier 38 will also effect a write of data to the memory cell 2 in the selected row associated therewith. Responsive to a row address transition at such time as ATD 14 is enabled by line EN/DIS_ at a high level, line WL for all rows must be at a low state prior to precharge of the bit lines BL and BL_, so that an indeterminate state is not written into memory cells 2.

It is preferable that the output of ATD 14 is a pulse having a predetermined pulse width which occurs upon the detection of a row address transition. For generating the control signal on line PC_, ATD 14 can, for example, generate a low logic level pulse on line 6 responsive to a row address transition with terminal EN/DIS_ at a high logic level, where line 6 directly drives the gates of transistors 46 and 48, accomplishing the precharge and equalization for each of the columns in array 22. Of course, other circuitry for generating the necessary PC_ signal responsive to a detected row address transition can alternatively be used. With no row address transition detected, or with ATD 14 disabled by the state of EN/DIS_, line PC_ will remain at a high logic level.

It should be noted that line PC_ can alternatively remain at an active low state during the entire cycle, if transistors 46 and 48 are sufficiently small that they will not upset the ability of sense amplifier 38 to sense and latch the data state of memory cell 2. Such an arrangement would of course reduce the control circuitry necessary for control of the PC_ line, but would increase the power dissipation of memory 10, and would also tend to degrade the amplitude of the differential signal on bit lines BL and BL_.

Figure 3A:
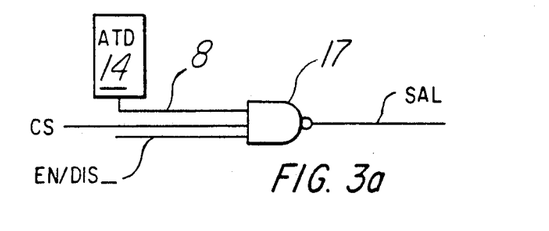
FIG. 3a is an electrical diagram, in schematic form, of sense amplifier latch control circuitry in the memory of FIG. 1.

In order to operate according to the invention, sense amplifier latch control circuitry 17 must control line SAL so that sense amplifier 38 is disabled from bit lines BL and BL_ during such time as the memory is being precharged, and during the decoding of the row address and energizing of the selected word line WL. Accordingly, line SAL is to be driven low after a row address transition while ATD 14 is enabled. In addition, in order to effect the fast access mode according to the invention, line SAL is to be at a high logic level, enabling sense amplifiers 38, during such time as no row address transion has been received, and during such time as ATD 14 is disabled. In addition, it is preferable in this embodiment that the data latched by sense amplifiers 38 be retained during such time as memory 10 is disabled (i.e., terminal CS is at a low logic level), so that the user of memory 10 can enter cache mode again after enabling memory 10, without requiring precharge, decoding of the same row address, and sensing of the data by sense amplifier 38.

Where the output of ATD 14 on line 8 consists of a high logic level pulse for a predetermined period of time responsive to a row address transition, a simple embodiment of sense amplifier control circuitry 17 which can accomplish the control of the signal on line SAL described above will now be described with reference to FIG. 3a. In this example, sense amplifier control circuitry 17 consists of a three-input NAND gate, having line 8 from ATD 14 at one input, terminal CS at another input, and terminal EN/DIS_ driving the third input; of course, the signals from terminals CS and EN/DIS_ can be buffered or communicated to NAND gate 17 through other circuitry, as desired. Line SAL is driven by the output of NAND gate 17.

Figure 3B:
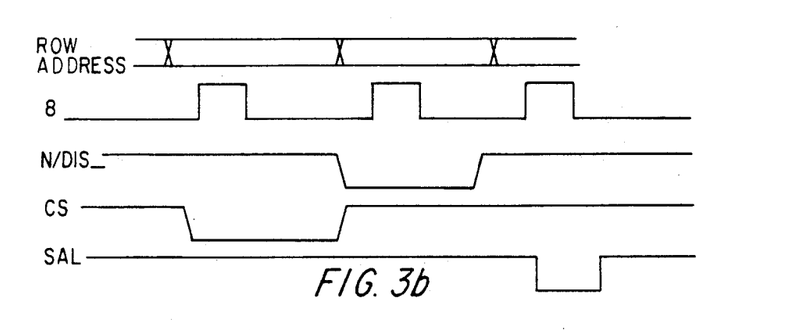

Referring to FIG. 3b, the operation of sense amplifier latch control circuitry 17 will now be described. At the first cycle in the exemplary sequence of FIG. 3b, a row address transition occurs, so a high logic level pulse is generated by ATD 14 on line 8 to NAND gate 17. In addition, line EN/DIS_ is at a high level, but terminal CS is at a low level, indicating that memory 10 is not selected. Accordingly, the output of NAND gate 17 remains at a high logic level during the period of time that the pulse on line 8 is presented, so that the contents of sense amplifiers 38 are retained. The second cycle also illustrates a condition where no low level pulse on line SAL is generated after a row address transition, as line EN/DIS_ is at a logic low level. It should be noted that this same control may be accomplished by using the signal at terminal EN/DIS_ to enable or disable the operation of ATD 14, in which case NAND gate 17 would not necessarily receive an input from terminal EN/DIS_, but ATD 14 would not present a pulse on line 8 responsive to a row address transition in the event that terminal EN/DIS_ is at a low logic level.

The third cycle in FIG. 3b illustrates that sense amplifier latch control circuitry 17 will generate a logic low level pulse on line SAL responsive to a row address transition (i.e., a pulse on line 8) when terminals CS and EN/DIS_ are both at a high level. The low logic level pulse will disable sense amplifier 38 by disconnecting the sources of transistors 40 from ground; of course, other methods for disabling sense amplifier 38 can alternatively be used. During this time, bit lines BL and BL_ can be precharged, and a new row address may be decoded by row decoder 15 and a row in array 22 energized responsive thereto. Upon the end of the low pulse of line SAL, sense amplifiers 38 will again be enabled to sense and latch therein the data state of the memory cell 2 in the associated column which is in the row corresponding to the new row address.

Figure 4:
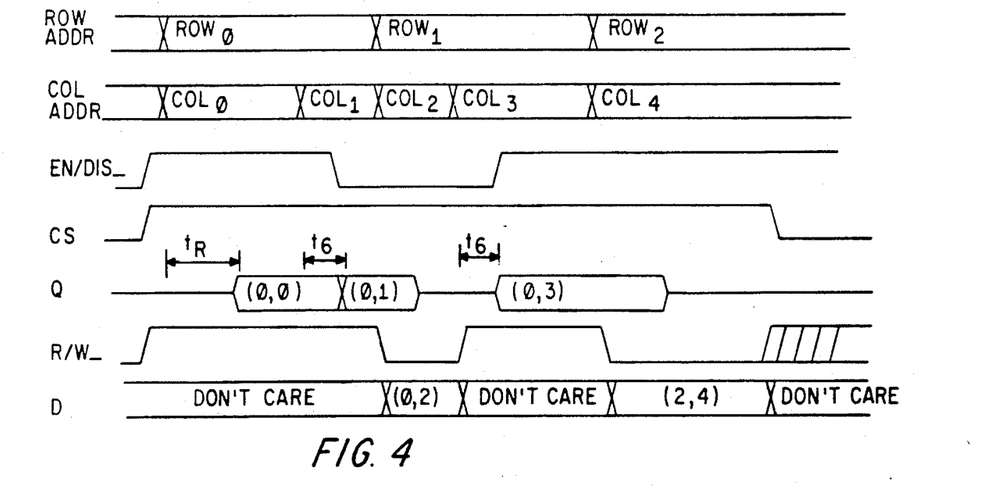
FIG. 4 is a timing diagram illustrating the operation of the memory of FIG. 1.

The operation of memory 10 constructed according to this first embodiment of the invention will no:; be described, with reference to FIG. 4. FIG. 4 illustrates the response of memory 10 of FIG. 1 to address and control signals, so that the fast access, or cache, mode of a memory according to the invention can be described.

As described above, memory 10 has the capability of a fast access mode, resembling cache operation, with this mode enabled by two methods. The first method of entering and staying in cache mode is the maintenance of the same row address for a number of successive column addresses. During this time, no precharge, row decode, or sensing operations are initiated, and column decode 18 will respond solely to the value of the column address (and the read/write signal at terminal R/W__). The second method by which memory 10 can enter and remain in the fast access, or cache, mode, is to disable the effect of ATD 14 by presenting a low logic level at terminal EN/DIS__. In this method, the portion of the full memory cycle which performs precharge, row decoding and sensing is inhibited, regardless of transitions of the row address. Column decode 18 will similarly respond solely to the column address signal, with read or write access to sense amplifiers 38 (and to the memory array 22) performed as in the prior method.

In the first cycle shown in FIG. 4, terminal EN/DIS__ is driven externally to a logic high level, indicating that ATD 14 is to be enabled such that the address transition detection of the row address will be enabled. Terminal CS is also at a high logic level, indicating that memory 10 is selected for operation. A transition of the row address and of the column address is received by memory 10 and, since ATD 14 is enabled by the high logic level at EN/DIS__, the precharge and sensing operations are performed on the row selected by the row address (in this case, the row address corresponding to row address $ROW_0$). Since the read/write signal R/W__ is at a high level indicating a read cycle, the value at terminal D is a don't care. After the operations of precharging the bit lines BL and BL__, decoding row address $ROW_0$, and sensing the data, the contents of the memory cell 2 at $ROW_0$, $COL_0$ are presented at output terminal Q. The access time of this read operation, requiring a full memory cycle, is the time $t_R$ at which the data appears at terminal Q after the row address transition.

For the second operation of FIG. 4, the column address makes a transition to the value $COL_1$, while the row address stays constant at the value $ROW_0$. Accordingly, since no row address transition has occurred, no precharge, row decode or sensing operation is to be performed. Accordingly, the contents of the memory cell 2 at $ROW_0$, $COL_1$ appears at output terminal Q at time $t_C$ after the column address transition. Since the precharge, row decode and sensing operations are not performed, the access time $t_C$ is much shorter than the full access time $t_R$ of the prior cycle.

Prior to the third cycle of FIG. 4, terminal EN/DIS__ receives a logic low level thereat. For memory 10 according to the invention, this signal disables ATD 14 from effecting the precharge, row decode and sensing operations responsive to a row address transition. In FIG. 4, after terminal EN/DIS__ is low, the transition of the row address from $ROW_0$ to $ROW_1$ occurs, but does not affect the operation of memory 10. In this cycle, a column address transition to column address $COL_2$ has occurred, and since the state of terminal R/W__ is now at a low logic level, a write of the data at input terminal D to the sense amplifier 38 for column $COL_2$, and to the memory cell at $ROW_0$, $COL_2$ (since the word line WL remains high, as described above), is effected. As noted above, memory 10 according to this embodiment is configured in the "write-through" mode, so that any write to the cache (i.e,. sense amplifiers 38) will also write the same data directly to the memory cell 2 associated therewith in array 22. Accordingly, in the event of a cache miss, no write-back of the cache contents into array 22 is required.

In the fifth operation of FIG. 4, terminal R/W__ returns to a high level to indicate that a read operation is desired. The transition of the column address to the value $COL_3$ thus effects a read from the sense amplifier 38 associated therewith, and the contents of the memory cell 2 at $ROW_0$, $COL_3$ will be presented at terminal Q. It should be noted that the contents of $ROW_0$, $COL_3$ are thus presented even though the current row address is the address $ROW_1$. Subsequent to this cycle, a transition of both the row address and the column address occurs, in conjunction with line EN/DIS__ being at a high level. Accordingly, a full cycle is performed, and in this case since a write operation is desired, the state of input terminal D is written into the memory cell 2 at $ROW_2$, $COL_4$, since the row address transition causes a new row to be decoded.

Subsequent to this cycle, terminal CS receives a low logic level thereat, responsive to which terminal Q will go to a high impedance state, as is conventional for sRAM devices. When not selected, as is well known in the art, memory 10 will be unaffected by the addresses and control signals applied thereto. In addition, according to the instant invention line SAL remains at a high level with terminal CS low so that, upon re-enabling of memory 10, the contents of sense amplifiers 38 from the prior row decode and sense operation will still be available for fast access, without requiring decoding of a new row address, responsive to a low-to-high transition at terminal CS in the conventional manner.

Figure 5:
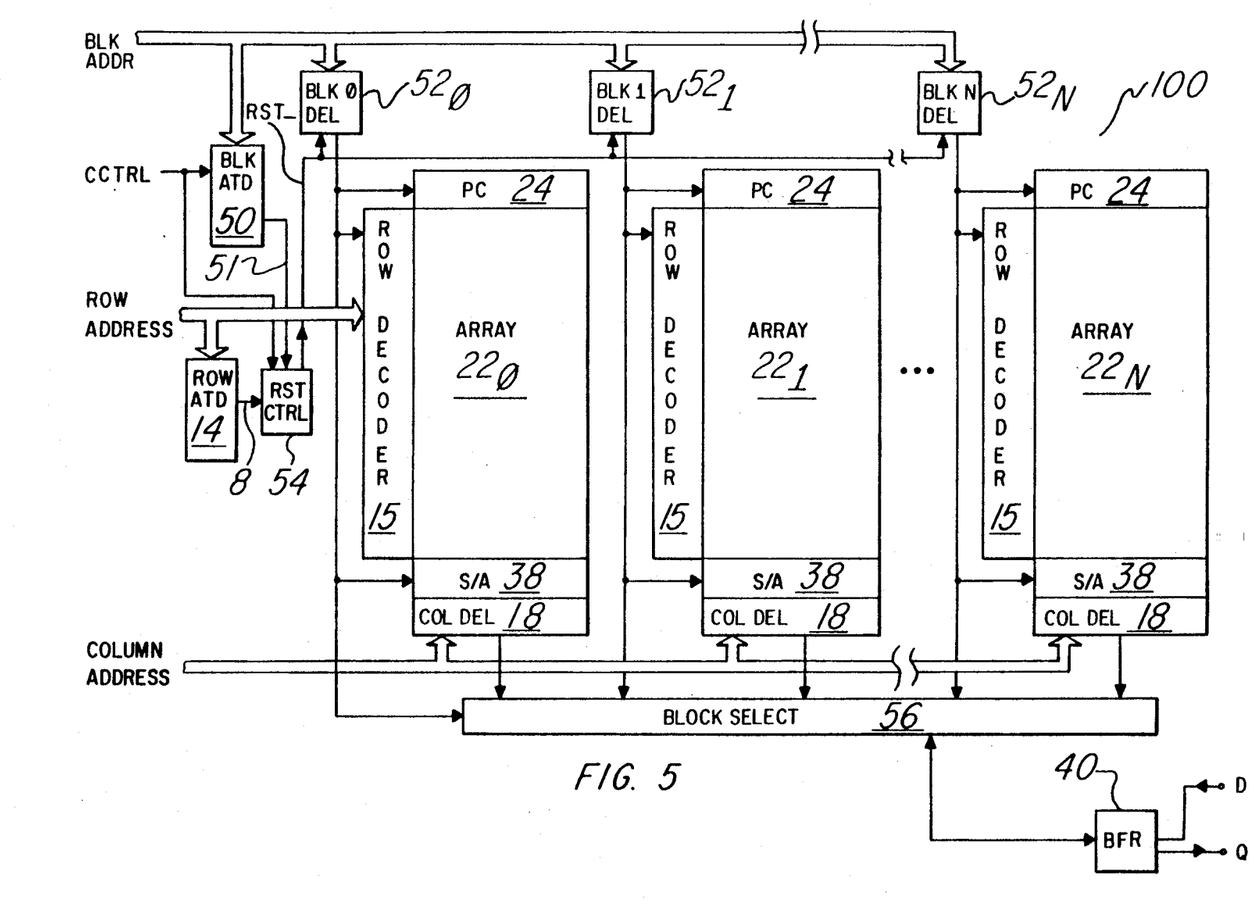
FIG. 5 is a block diagram of a static RAM constructed according to a second embodiment of the invention.

Referring now to FIG. 5, the construction and operation of a memory 100 according to a second embodiment of the invention will be described. Memory 100 is a single memory having its memory array organized into blocks $22_0$ through $22_n$, each having rows and columns of memory cells therein. The construction of the memory cells and sense amplifiers 38 for a static RAM implementation of memory 100 is preferably as described hereinabove for memory 10, as shown in FIGS. 1, and 2, but of course other construction for memory 100 may alternatively be used, similarly as such alternatives for memory 10. Each of the array blocks 22 of memory 10 are associated with precharge circuitry 24, a row decoder 15, sense amplifiers 38, and a column decoder 18, similarly as the single block array 22 of memory 10 described hereinabove. The size of the array, blocks 22 in memory 100 is preferably of a size having the same number of rows as a single array memory, but with the columns of the memory separated into the blocks $22_0$ through $22_n$. In the example of a 64 kbit memory having four blocks, each of the array blocks 22 would have 256 rows of 64 columns therein. The splitting of the array by columns into array blocks 22 is believed to be preferable in improving the cache hit rate of the memory 100 relative to a single block memory.

The block organization of memory 100 of FIG. 5 allows for improved memory performance, primarily due to an improved cache hit rate. For most memory systems, the hit rate for a larger number of smaller cache lines is greater than that for a single large cache line. This is because the likelihood of a given bit to be accessed decreases with the distance (in memory address) from the prior bit. Accordingly, the incremental likelihood of a cache hit decreases as the cache line becomes larger. At a certain point, of course depending upon the particular system application, it is more preferable to have cache lines associated with different main memory addresses (in this case, different row addresses) than to have larger caches. The memory 100 of FIG. 5 addresses this factor in its block organization.

In memory 100 of FIG. 5, each of the array blocks $22_0$ through $22_n$ has a group of sense amplifiers 38 associated therewith. A group of sense amplifiers 38 associated with an array block 22 stores data for a row of that particular array block 22, independently from the data stored by the sense amplifiers 38 for the other array blocks 22. This allows the sense amplifiers 38 for array block $22_0$ to store data from a different row than that stored by the sense amplifiers 38 for array block $22_n$, in effect creating n cache lines in memory 100. This organization provides for independent access and storage of data from different rows in each of the groups of sense amplifiers 38. Accordingly, data associated with multiple row address can be accessed in the cache mode (if the data is held by the sense amplifiers 38 for an array block 22), without requiring a precharge, row decode, and sense operation.

Memory 100 according to this embodiment of the invention receives, as part of the memory address presented thereto, a block address. The block address of memory 100, where array blocks 22 are formed by dividing the total number of columns, will consist of the most significant portion of the column address. For the example of four array blocks 22, two of the bits of the address (e.g., the two most significant column address bits) would serve as the block address. The block address received at the block address terminals is communicated to a block address transition detection circuit 50, as well as to block decoders $52_0$ through $52_n$, associated on a one-to-one basis with array blocks $22_0$ through $22_n$. Block decoders 52 control the precharge circuitry 24, row decoder 15, and sense amplifiers 38 associated with its array block 22, as will be described in greater detail hereinbelow.

Memory 100 further includes row address ATD 14, and input/output buffer 40 connected to terminals D and Q, in the same manner as memory 10 described hereinabove. The read/write circuitry (not shown in FIG. 5 for purposes of clarity) of memory 100 operates in much the same manner, responsive to a read/write signal, as that of memory 10 described hereinabove.

In addition to the block decoders 52, memory 100 includes block select 56, which is for selecting sense amplifier(s) 38 associated with one of the array blocks 22 to be communicated to input/output buffer 40, responsive to the block address. In this embodiment, a sense amplifier 38 for each array block 22 may be selected by each of the column decoders 18 responsive to the least significant portion of the column address (i.e., the portion of the column address which is not the block address), with the communication of the sense amplifier 38 from one of the array blocks 22 selected according to the block address. Block select 56 receives a signal from each of the block decoders 52, for selecting the sense amplifier(s) 38 associated with one of the array blocks 22 for communication with input/output buffer 40, according t the block address.

Block ATD 50, responsive to a transition in the state of the block address, generates a signal on line 51 which is communicated to reset control circuitry 54. Terminal CCTRL receives a signal, hereinafter referred to as the "cache control signal", which enables block ATD 50 in a manner similarly as the EN/DIS_ signal controls ATD 14 in memory 10 described above. The cache control signal at line CCTRL is also communicated directly to reset control circuitry 54. Row ATD 14 communicates a pulse on line 8 to reset control circuitry 54 in the event of a row address transition, in a similar manner as previously described. Reset control circuitry 54 generates a reset signal on line RST_ to each of block decoders 52, indicating that a precharge, row decode and sensing operation is to be initiated for the array block 22 which is selected by the block address.

According to this second preferred embodiment, memory 100 can thus remain in the fast access, or cache, mode to access data associated with different addresses. In this embodiment, three methods for causing a reset (i.e., disabling of sense amplifiers 38, precharge, row decode, and sensing of data) are available. A first method by which a reset is initiated is by way of a row address transition. A row address transition will cause the selected array block 22 in memory 100 to precharge the bit lines BL and BL_ therein, decode the new row address value, and sense the data for the newly selected row. A second method by which a reset is initiated is by way of a block address transition when the cache control signal is at a logic low level. The array block 22 which is newly selected by the block address will be reset in this event. The third method by which a reset of an array block 22 will be initiated is by way of a high-to-low transition of the cache control signal; it is believed that such a "hardware" reset is desirable in a block-organized memory such that a reset can be accomplished without necessarily presenting a new row address thereto. Accordingly, once in the cache mode, memory 100 thus remains in cache mode without a precharge, row decode and sensing operation for multiple accesses within the same row in the same array block 22, and for accesses of multiple array blocks 22 so long as the cache control signal at terminal CCTRL remains at a high logic level.

It should be noted that during the reset (precharge, row decode and sensing) operation for one of array blocks 22, the others of array blocks 22 will not be affected. For a memory 100 constructed similarly as described relative to FIGS. 1 and 2, the sense amplifier latch signal SAL for sense amplifiers 38 which are not being reset should remain at a high logic level, so that the data stored therein is available in cache mode when the particular array block 22 is accessed.

Figure 6A:
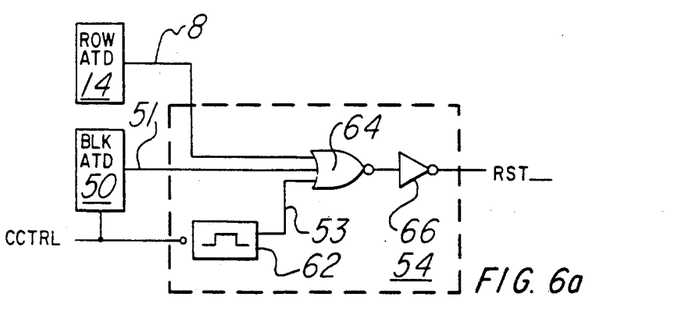
FIGS. 6a and 6b are electrical diagrams, in schematic form, of control circuitry in the memory of FIG. 5.

Referring now to FIG. 6a, an example of reset control circuitry 54 for generating a reset signal on line RST_ according to the above-described operation, will be described in detail. In this embodiment, reset control circuitry 54 receives signals from row ATD 14 on line 8, from block ATD 50 on line 51, and from terminal CCTRL. Line 8 from row ATD 14 and line 51 from block ATD 50 are communicated directly to inputs of NOR gate 64 in reset control circuitry 54. It is assumed, for purposes of this description, that a high logic level pulse is generated by each of ATDs 14 and 50 responsive to a transition of the address received thereby, with the logic level of lines 8 and 51, respectively, remaining low in the absence of a transition; it is further assumed that a low logic level on line CCTRL will disable block ATD 50 from generating a pulse on line 51 responsive to a transition of the state of the block address. A line from terminal CCTRL is received at a negative input of monostable multivibrator ("one-shot") 62, so that one-shot 62 generates a positive pulse on line 53 responsive to a high-to-low transition of the cache control signal received at terminal CCTRL. Line 53 from one-shot 62 is connected to the third input of NOR gate 64. Accordingly, upon the presence of a high logic level pulse at any of the inputs of NOR gate 64, a low logic level pulse will be driven at line RST_ by inverter 66 connected to the output of NOR gate 64. As shown in FIG. 5, line RST_ is connected to each of the block decoders 52.

Reset control logic 54 thus generates a low logic level pulse on line RST_ responsive to a transition of the row address (pulse on line 8 from row ATD 14), a transition of the block address during such time as the cache control signal is low (pulse on line 51 from block 50), or a high-to-low transition of the cache control signal at terminal CCTRL (pulse on line 53 from one-shot 62).

Figure 6B:
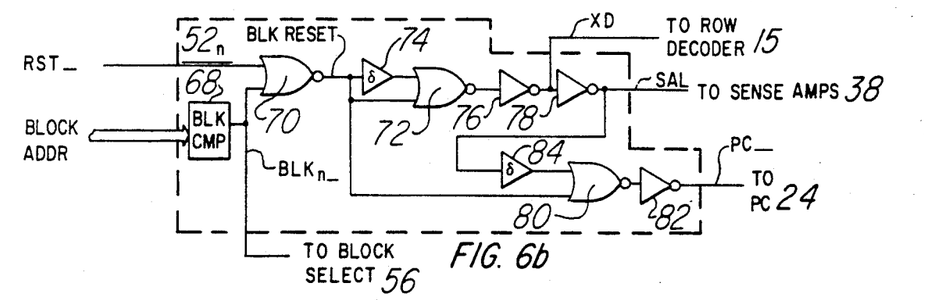

Referring now to FIG. 6b, the construction of one of block decoders $52_n$ will now be described in detail. Block decoder $52_n$ receives the reset signal on line RST at one input, and the block address from the block address terminals at another input. Contained within block decoder $52_n$ is a block comparator 68 which determines if the block address received from the block address terminals matches the address of the array block $22_n$ associated with array block 22. If the block address matches, block comparator 68 issues a low level signal at its output on line $BLK_n$. Line $BLK_n$ is communicated to block select 56 so that buffer 40 is put in communication with the sense amplifiers 38 associated with the array block $22_n$ selected by the block address, as shown in FIG. 5. Line $BLK_n$ is also communicated to one input of NOR gate 70. It should be noted that block comparator 68 is operable to compare the block address in the absence of a reset signal on line RST_, so that block select 56 selects the proper array block 22 for communication with terminals D and Q.

NOR gate 70 receives line RST_ at its other input. If both a low logic level signal is present at line RST_, indicating that reset control circuitry has detected that a reset of one of array blocks 22 is to be performed, and a low logic level signal is present at line $BLK_n$, indicating that the array block $22_n$ associated with block decoder $52_n$ is the selected array block, NOR gate 70 will drive a logic high level at its output. The output of NOR gate 70 is connected to line BLK RESET, a high logic level at which will be used to generate the PC_, XD and SAL signals for array block $22_n$. precharge, row decode and sense portion of a full memory cycle.

Line BLK RESET is connected directly to a first input of NOR gate 72, and is connected through non-inverting delay stage 74 to a second input of NOR gate 72. The signal at the output of NOR gate 74 is thus a low logic level pulse of a duration substantially equal to the width of the pulse on line BLK RESET plus the length of the delay of delay stage 74. The length of the delay through delay stage 74 will correspond to the desired pulse width of the signal XD to row decoder 15 and the low logic level pulse of line SAL. The length of the delay of delay stage 74 will depend upon the desired timing of the row decode and sense amplifier latch operations in the cycle, for the particular design of memory 100.

The output of NOR gate 72 is connected, through inverter 76, to line XD which is communicated to row decoder 15 associated with the array block $22_n$. A high logic state on line XD in this embodiment causes row decoder 15 to discharge all word lines WL so that no row is selected in array block $22_n$, and also to initiate decoding of the row address at the row address terminals and energize the word line WL of the row in array block $22_n$ associated therewith. Line XD is also connected via inverter 78 to line SAL, which is connected to sense amplifiers 38 associated with array block $22_n$ to disable and enable the same as described above relative to FIG. 2. A high logic level on line XD will thus generate a low logic level on line SAL. Accordingly, row decoder 15 will be enabled, and sense amplifiers 38 disabled, responsive to a block reset operation.

The output of NOR gate 70, on line BLK RESET, is also connected to a first input of NOR gate 80. Another input of NOR gate 80 receives the state of line SAL, delayed by non-inverting delay stage 84. The output of NOR gate 80, inverted by inverter 82, generates the signal on line PC_ which is communicated to the gates of p-channel transistors 46 and 48 in array block $22_n$. A low logic level will appear at line PC_ in this embodiment responsive to line BLK RESET returning to a low logic level (i.e., at the end of the low logic level pulse on line RST_) after line SAL has been at a low logic level. A low logic level on line PC_ will cause bit lines BL and BL_ to be precharged to equal potentials relative to one another, in preparation for the memory cell 2 which is in the row selected by the row address to be connected thereto for sensing by one of sense amplifiers 38, as described hereinabove. According to this embodiment, precharge of the bit lines BL and BL_ is prevented from occurring until after the sense amplifiers 38 have been disabled by line SAL for array block $22_n$.

The low level of the precharge signal on line PC_ will continue for the length of delay of delay stage 84 after line SAL returns to a high logic level. It should be noted that transistors 46 and 48 used to precharge a column in array block $22_n$, as described above, are generally relatively small compared to the transistors in sense amplifiers 38, so that these transistors 46 and 48 can remain in a conductive state at a point in time after sense amplifier latch signal SAL has returned to a high logic level, ensuring that bit lines BL and BL_ are at a determinate precharged and equalized state at the time of sensing.

It should further be noted that line PC_ could alternatively be kept at a low logic level throughout the cycle, in effect causing transistors 46 and 48 to act as a static load to bit lines BL and BL_. In this arrangement, the precharge and equalization would occur automatically upon the word line WL and sense amplifier latch signal SAL both being inactivated upon reset. It should be noted that such an arrangement would simplify the control circuitry described above, but at a cost of additional power dissipation and reduced differential signals on the bit lines to be sensed by sense amplifiers 38. The choice between these two methods can be made according to the characteristics of the memory 100 in which the invention can be incorporated.

It should be noted that many configurations of the reset control circuitry 54 and the block decoders $52_n$ may alternatively be used to accomplish the same or equivalent functions. The description of the particular circuits in FIGS. 6a and 6b is intended by way of example only.

Figure 7A:
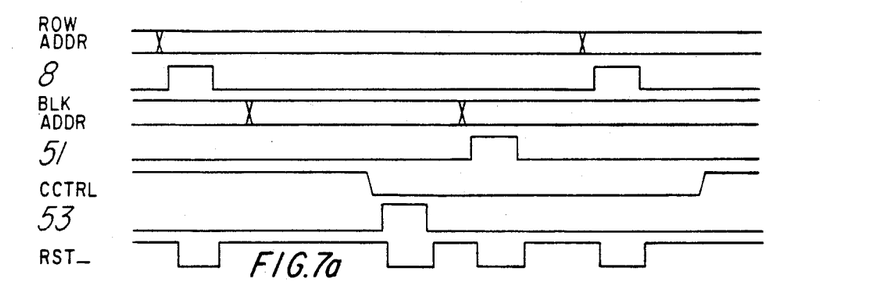
FIGS. 7a and 7b are timing diagrams illustrating the operation of the circuitry of FIGS. 6a and 6b, respectively.
Figure 7B:
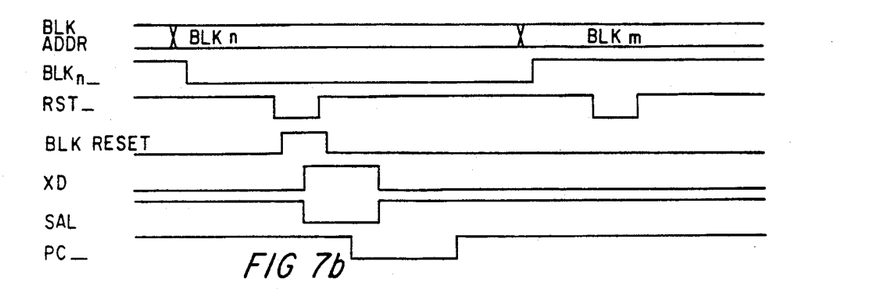

Referring now to FIGS. 7a and 7b, the operation of reset control circuitry 54 and block decoder $52_n$ described hereinabove relative to FIGS. 6a and 6b will be described in detail. As mentioned above, memory 100 will remain in the fast access, or cache, mode for multiple accesses of an array block 22 with the same row address, and for accesses of multiple array blocks 22 with the cache control signal at a high logic level. Also as described above, memory 100 allows for three methods of initiating reset of an array block 22: a row address transition, a block address transition with the cache control signal at a low level, and a high-to-low transition of the cache control signal. The sequence illustrated in FIGS. 7a and 7b will illustrate examples of possible sequences, to explaining the operation of these circuits.

FIG. 7a illustrates the operation of reset control circuitry 54 in generating a reset signal on line RST— to block decoders $52_n$. The first operation shown in FIG. 7a is a transition of the row address, which causes row ATD 14 to issue a pulse on line 8 to reset control circuitry 54. Responsive to the pulse on line 8, NOR gate 64, through inverter 66, issues a logic low level pulse on line RST—. Block decoder 52 which is associated with array block 22 selected by the block address will, responsive to the reset signal, initiate precharge, decoding of the new row address, and the sensing operation so that the contents of the newly selected row can be loaded into sense amplifiers 38 for access.

As noted above relative to memory 10, memory 100 is configured so that any data written to sense amplifiers 38 associated with the selected array block 22 is simultaneously written into the memory cell 2 associated with the sense amplifiers (i.e., memory 100 is configured as "write-through" cache), so the contents of sense amplifiers 38 need not be written back into array block 22 prior to the reset operation.

During this operation, terminal CCTRL is at a high logic level; it will be apparent from this description that the state of the cache control signal received at terminal CCTRL does not affect the operation of reset control circuitry 54 for row address transitions. It should further be noted that multiple cache accesses, both reads and writes, may be performed between the reset operations illustrated in FIG. 7a.

The next operation illustrated in FIG. 7a is a block address transition. Since the cache control signal at terminal CCTRL at a high logic level, however, the operation desired by the user of memory 100 is access of the data already latched by sense amplifiers 38 associated with a different array block 22, with no reset to be performed. According to the embodiment of FIG. 6a, block ATD 50 is disabled by the cache control signal at a high level, so no pulse appears on line 51. Accordingly, reset control circuitry 54 does not issue a reset signal on line RST—. It is contemplated that many block address transitions will usually be done while remaining in the fast access (cache) mode (i.e., one may wish to stay in cache mode but successively access multiple cache lines). In this embodiment, so long as the cache control signal at terminal CCTRL remains at the high logic level, the fast access of data from the sense amplifiers 38 of different array blocks 22 can be performed.

The cache control signal at terminal CCTRL next makes a high-to-low transition. As noted above, it may be desirable to have the capability of resetting an array block 22 without necessarily making an address transition. An example of a use for this operation is illustrated in the sequence of FIG. 7a, where the row address used to reset a first block is to be accessed in a second block, after first accessing the prior contents of the second block. This is accomplished by the row address transition for a first block, a block address transition with the cache control signal high, followed by the high-to-low transition of the cache control signal. Responsive to the transition of the cache control signal, one-shot 62 in reset control circuitry 54 of FIG. 6a issues a high logic level pulse to NOR gate 64, which causes a low logic level pulse to be presented by inverter 66 on line RST—. The reset operation for the selected array block 22 is then performed, including decode of the row address present at the row address terminals.

It should be noted that the cache control signal transition to a low logic level can be done substantially simultaneously with a row address transition, a block address transition, or both. This provides the ability to perform an access of a data bit not previously stored in any of sense amplifiers 38, with a single reset cycle.

Referring back to FIG. 7a, the next operation is a block address transition. Since the cache control signal at terminal CCTRL is at a low logic level, block ATD 50 :;ill issue a pulse on line 51 which will generate a reset signal on line RST—. Array block 22 which is newly selected by the block address will then enter the precharge, row decode and sensing portion of a full memory cycle, selecting the row corresponding to the row address at the row address terminals. It should be noted that a row address transition can occur substantially simultaneously with the block address transition, such that a different row can be accessed for the new array block 22 in a single direction.

A row address transition next occurs in the exemplary sequence of FIG. 7a. ATD 14 issues a pulse on line 8 responsive thereto, casing reset control circuitry 54 to issue a reset signal on line RST—. It should be noted that the cache control signal is at a low level during this operation, and that the state of the cache control signal does not affect the operation of memory 100.

The cache control signal at terminal CCTRL next takes a low-to-high transition, again providing the ability to access multiple array blocks 22 in cache mode. Since no reset operation is necessary to accomplish this, reset control circuitry 54 is not responsive to this transition of the cache control signal.

Referring now to FIG. 7b, the operation of the block decoder $52_n$ of FIG. 6b upon receipt of a low logic level pulse on line RST— will now be disturbed. As described above, only the one of block decoders 52 which is associated with the selected array block 22 will be responsive to the reset signal on line RST—. For purposes of this description, block decoder $52_n$ is associated with array block $22_n$, and not with array block $22_m$. It should further be noted that for block address transitions, the selected array block 22 is the array block 22 associated with the new block address.

In FIG. 7b, the first operation performed is a block address transition to the address associated with array block $22_n$. Responsive to receiving the new block address, block comparator 68 issues a low level logic signal on lien $BLK_{n-}$, indicating that the new block address matches that associated with array block $22_n$ associated with block decoder $52_n$ of FIG. 6b. The low level signal on line $BLK_{n-}$ is communicated to block select 56 of FIG. 5 (regardless of the state of the reset signal on line RST—), and also to the remainder of block decoder $52_n$.

Since a block address transition has occurred, reset control circuitry 54 issues a low level logic pulse on line RST—, as described above. Responsive to the state of line $BLK_{n-}$ at a low logic level in conjunction with the reset signal, NOR gate 70 of block decoder $52_n$ issues a high logic level pulse at its output, line BLK RESET, for the duration of the reset signal on line RST— from reset control circuitry 54.

As described above, in this embodiment the operations which are to be performed in a reset operation include decoding of the row address, disabling and reenabling of the sense amplifiers, and precharge of the bit lines. Responsive to the pulse on line BLK RESET, NOR gate 72 presents, through inverter 76, a high logic level pulse on line XD to row decoder 15 of array block $22_n$. Since NOR gate 72 receives line BLK RESET at one input and the state of line BLK RESET delayed by delay stage 74 at the other input (see FIG. 6b), the pulse on line XD will begin with the beginning of the pulse on line BLK RESET, and continue until the delay of delay stage 84 has elapsed after line BLK RESET has returned to a low logic level. The pulse on line XD as described above, controls row decoder 15 to disable the word line WL with the prior row address, decode the row address and energize the word line WL associated with the new row address.

Via inverter 78, line SAL is driven to be at a low logic level essentially simultaneously with the high logic level pulse on line XD (delayed, of course, by such delay as inverter 78 introduces). As described above relative to FIG. 2, a low level on line SAL will disable sense amplifiers 38 associated with array block 22 from sensing or retaining the data state of bit lines BL and BL__; disabling of sense amplifiers 38 is desired during such time as no word lines WL are activated, so that an incorrect data state is not latched into sense amplifiers 38 which can affect the data state of the memory cells in the new row. As mentioned above, the length of the pulses on lines XD and SAL during a reset operation depends upon the pulse width of the reset signal on line RST__ and on the delay of delay stage 74; the length of these pulses will of course depend upon the design and operating characteristics of the particular memory 100. Upon the expiration of the length of the delay of delay stage 74, line SAL will return to a high logic level, initiating the sensing operation by sense amplifiers 38 for the selected row in the associated array block $22_n$.

Referring back to FIG. 6b, NOR gate 80 receives at its inputs the line BLK RESET and line SAL delayed by delay stage 84. The output of NOR gate 80 is inverted by inverter 82 to drive line PC__ which is connected to the gates of precharge transistors 46 and equalization transistor 48 for array block $22_n$. NOR gate 80 presents a high logic level at its output, which generates the active low state on line PC__, when both the BLK RESET line and the delayed state of line SAL are low. Since line SAL remains high except during a reset operation, line PC__ will remain high in the absence of a reset cycle, even though line BLK RESET is at a low logic level. Therefore, line PC__ is driven to a low logic level upon the return of line BLK RESET to a low logic level after initiating a reset sequence, at such time as the delay of delay stage 84 elapses after line SAL has gone to a low logic level. Delay stage 84 ensures that the word line WL with the prior selected line and also sense amplifiers 38 are both disabled prior to the time that the precharge is initiated so that the precharged data state is not inadvertently written into the memory cells 2 of the prior selected row.

Line PC__ remains at a low logic level until the delay of delay stage 84 has elapsed after line SAL has returned to a high logic level. This ensures that bit lines BL and BL__ are not floating at the time that sense amplifiers 38 are again connected thereto, as the floating bit lines could conceivably result in mis-sensing of the data in the selected row. As described above, precharge transistors 46 and equalization transistors 48 are preferably small enough that such an overlap of the precharge and sensing operations can occur without undue degradation of the signal being sensed.

The block organization of memory 100 according to the invention thus provides for improved memory performance, due to the multiple cache lines provided by the groups of sense amplifiers 38 associated with the multiple array blocks 22. For those applications for which the likelihood of an access of another array block 22 exceeds the likelihood of accessing a bit in the same long (e.g., 256 bit) row but distant from the initial bit, the cache hit rate of memory 100 will be improved over a single block memory such as memory 10 of the first embodiment described herein.

Although the invention has been described in detail herein with reference to its preferred embodiments, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

I claim:

1. A memory device, comprising:
   memory cells, arranged in a plurality of rows and a plurality of columns,
   address terminals, connected to a row decoder and a column decoder, for receiving a memory address comprised of a row portion and a column portion;
   a row decoder for selecting one of said plurality of rows of said memory cells responsive to a row portion of said memory address;
   circuitry for generating an enable signal in response to a transition in a selective portion of said address, wherein said selective portion is not the complete address;
   a plurality of latches being equal in number to the plurality of columns, each for receiving and retaining the data state of an associated memory cell in the row selected by said row decoder, wherein each latch, in response to said enable signal, receives and retains a data state from each memory cell which corresponds to said selective portion of said address; and
   a column decoder for selecting a latch for communication with a data terminal responsive to a column address, wherein at least one selection of said latches occurs in response to a series of transitions in the remaining portion of said address.

2. A method of accessing a memory circuit, comprised of a plurality of rows and columns of memory cells, each cell having a row and column address, comprising the steps of:
   decoding a row address for selection of one of a plurality of rows of memory cells responsive to a row address;
   generating an enable signal in response to a transition in a selective portion of said address, wherein said selective portion is not the complete address;
   latching said memory cells which correspond to said selective portion of said address in response to said enable signal;
   decoding a column address for selection of a latch for communication with a data terminal responsive to a column address, wherein at least one selection of the latches occurs in response to a series of transitions in the remaining portion of said address.

3. The memory device of claim 1, wherein said circuitry for generating said enable signal comprises:
an address detection circuit for detecting a transition in the state of said selective portion of said memory address, and for generating an enable signal responsive to such a transition.

4. The memory device of claim 1, wherein said circuitry for generating said enable signal comprises:
an address transition circuit for detecting a transition in the state of said selective portion of said memory address, and for generating a transition signal responsive to such a transition; and
latch control circuitry having an input for receiving said transition signal, and for generating said enable signal responsive to receipt of said transition signal.

5. The memory device of claim 3, wherein said address transition detection circuit also receives an enable/disable signal, so that responsive to said enable/disable signal indicating a disable condition, said address transition detection circuit is inhibited from generating said transition signal responsive to a transition of said selective portion of said address.

6. The memory device of claim 1, wherein said circuitry for generating said enable signal also receives an enable/disable signal, so that responsive to said enable/disable signal indicating a disable condition, said circuitry is inhibited from generating said enable signal responsive to a transition of said selective portion of said address.

7. The memory device of claim 1, wherein said latches comprises latching sense amplifiers.

8. The memory device of claim 7, wherein each of said sense amplifiers is associated with a single column in said array.

9. The memory device of claim 7, wherein each of said sense amplifiers is associated with a plurality of columns in said array.

10. The memory device of claim 1, wherein said selective portion of said memory address is said row portion of said memory address, so that said latches are enabled to receive the data state of each of the memory cells in the row selected by the row decoder responsive to the value of the row portion of said memory address subsequent to said transition.

11. The memory device of claim 1, wherein said columns are in communication with said latches by way of differential bit lines; and further comprising:
precharge circuitry for precharging said bit lines responsive to a transition of said selective portion of said memory address.

12. The memory device of claim 11, wherein said row decoder selects a row of said memory cells corresponding to the state of said row potion of said memory address responsive to a transition of said selective portion of said memory address.

* * * * *